(12) United States Patent
Wu et al.

(10) Patent No.: US 6,449,301 B1
(45) Date of Patent: Sep. 10, 2002

(54) METHOD AND APPARATUS FOR MODE LOCKING OF EXTERNAL CAVITY SEMICONDUCTOR LASERS WITH SATURABLE BRAGG REFLECTORS

(75) Inventors: Ming C. Wu, Pacific Palisades, CA (US); Ji-Lin Shen, Chung-Li (TW)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 09/338,458

(22) Filed: Jun. 22, 1999

(51) Int. Cl.⁷ .................................................. H01S 3/10
(52) U.S. Cl. ........................... 372/92; 372/18; 372/25; 372/50; 372/99; 372/102
(58) Field of Search ............... 372/18, 92, 98, 372/99, 25, 46, 50, 102, 11

(56) References Cited

U.S. PATENT DOCUMENTS 5,257,276 A * 10/1993 Forouhar et al. ............. 372/45
5,509,026 A * 4/1996 Sasaki et al. ................. 372/45
5,701,327 A * 12/1997 Cunningham et al. ........ 372/99

OTHER PUBLICATIONS

"Monolithic Colliding–Pulse Mode–Locked Quantum–Well Lasers" by Chen, et al., vol. 28, No. 10, Oct. 1992.

Proposal Abstract "Ultra High Speed Photonic Devices for Tbit/sec Systems" by Principle Investigator Ming C. Wu, et al., Mar. 14, 1996.

* cited by examiner

*Primary Examiner*—James Davie
(74) *Attorney, Agent, or Firm*—Daniel L. Dawes; Myers, Dawes & Andras LLP

(57) ABSTRACT

External cavity semiconductor lasers using a saturable Bragg reflector as an external reflector are mode locked and produce output pulses of 1.9 ps from a semiconductor lasers without dispersion compensation. By coupling the output to a standard single mode fiber with a length of 35 m to compensate the linear chirp, the mode-locked pulse duration as short as 880 fs is achieved.

21 Claims, 4 Drawing Sheets

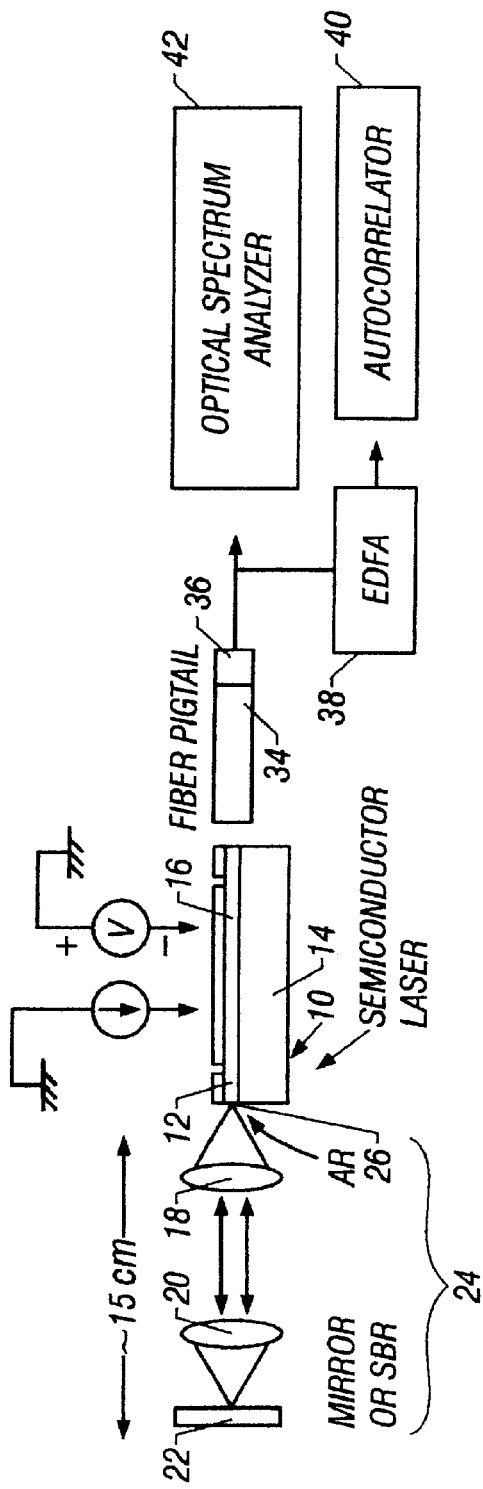
FIG. 1
FIG. 1A
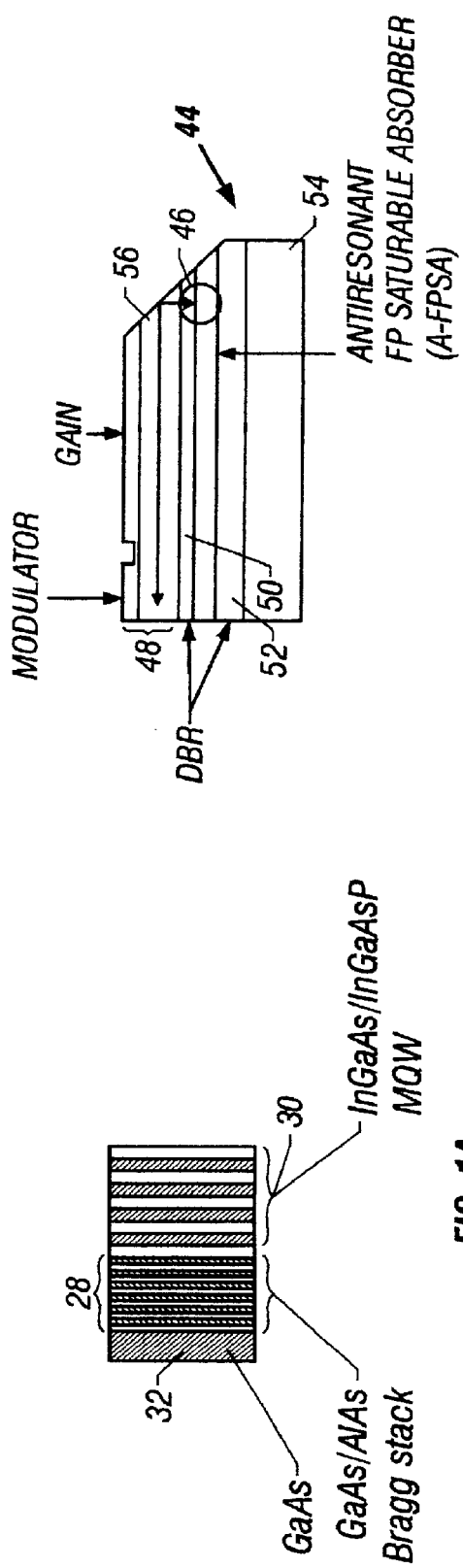
FIG. 8

METHOD AND APPARATUS FOR MODE LOCKING OF EXTERNAL CAVITY SEMICONDUCTOR LASERS WITH SATURABLE BRAGG REFLECTORS

BACKGROUND OF THE INVENTION

1. Field of the Invention

The invention relates to semiconductor lasers and in particular to mode locked semiconductor lasers having an external resonant cavity.

2. Description of the Prior Art

Ultrashort optical pulses have found broad applications in electrooptic sampling, broad-band submillimeter-wave generation, optical computing, and other areas of optoeletronics. Mode locked semiconductor lasers in particular are compact sources of ultrashort pulses. Passive and hybrid mode locking has been employed to generate subpicosecond pulses in semiconductor lasers. The saturable absorber used in a passive or hybrid mode locked semiconductor laser needs to satisfy the following requirements: (1) the absorber should saturate faster than the gain media; and (2) the recovery time of the saturable absorber should be faster than that of the gain media.

Two main kinds of semiconductor saturable absorbers have been investigated for passive mode locking: (1) proton-bombarded semiconductors; and (2) semiconductor quantum wells. The quantum-well absorbers, whose absorption saturation is due to the screening of excitons by free carriers, are very attractive for passive mode locking because they are inexpensive, compact, cover a wide wavelength range, and have fast response time. See, L. R. Brovelli, I. D. Jung, D. Kopf, M. Kamp, M. Moser, F. X. Kartner, and U. Keller, "Selfstarting Soliton Mode locked Ti-Sapphire Laser Using A Thin Semiconductor Saturable Absorber", Electron. Lett. Vol. 31, pp.287, 1995. Recently, a low-loss, epitaxially grown semiconductor saturable Bragg reflector (SBR) was demonstrated to be a powerful saturable absorber for passive mode locking. See, L. R. Brovelli, supra; S. Tusda, W. H. Knox, S. T. Cundiff, W. Y. Jan, and J. E. Cunningham, "Mode-Locking Ultrafast Solid-State Lasers With Saturable Bragg Reflectors" IEEE J. of Selected Topics in Quantum Electron. Vol.2, pp. 454, 1996; S. Tusda, W. H. Knox, E. A. de Souza, W. Y. Jan, and J. E. Cunningham, "Low-Loss Intracavity Alas/Algaas Saturable Bragg Reflector For Femtosecond Mode Locking In Solidstate Lasers", Opt. Lett., Vol.20, pp. 1406, 1996; B. C. Collings, J. B. Stark, S. Tsuda, W. H. Knox, J. E. Cunningham, W. Y. Jan, and R. Pathak, "Saturable Bragg Reflector Self-Starting Passive Mode Locking Of A $Cr^{4+}$:Yag Laser Pumped With A Diode-Pumped Nd:$YVO_4$ Laser" Opt. Lett., Vol.21, pp. 171, 1996; S. Tusda, W. H. Knox, and S. T. Cundiff, "High Efficiency Diode Pumping Of A Saturable Bragg Reflector-Mode-Locked Cr:Lisaf Femtosecond Laser" Appl. Phys. Lett. Vol.69, pp. 1538, 1996; and W. H. Loh, D. Atkinson, P. R. Morkel, M. Hopkinson, A. Rivers, A. J. Seeds, and D. N. Payne, "Passive Mode-Locked $Er^{3+}$ Fiber Laser Using A Semiconductor Nonlinear Mirror", IEEE Photon. Technol. Lett., Vol. 5, 35, 1993. The saturable Bragg reflector consists of semiconductor quantum wells embedded in a Bragg reflector and functions as a nonlinear mirror for saturable absorption. This design reduces the losses introduced in the cavity and increases the saturation intensity and the damaging threshold. Femtosecond pulses have been generated using saturable Bragg reflector in passive solid-state lasers and fiber lasers as described in certain ones of the above references.

Although there has been progressed by using the solid state lasers with saturable Bragg reflector, semiconductor optical sources have some special advantages. For example, the semiconductor lasers provide the advantages for high quantum efficiency, electrically pumped and high repetition frequency in the optical communication system. To date, the semiconductor lasers combined with the saturable Bragg reflector have, however, not been studied or understood.

Monolithic mode-locked semiconductor lasers generating 100 fs optical pulses with high pulse energy play an important role for high-bit rate time-division multiplexed (TDM) systems. Though such short optical pulses have been demonstrated in semiconductor gain medium using external cavities and additional pulse compression, those lasers are very bulky and not suitable for practical applications. Monolithic mode-locked semiconductor lasers are compact, light weight, energy efficient, and do not require optical alignment. Though very impressive performance (600 fs pulse width, 350 GHz repetition frequency) has been demonstrated, the pulse energy of this type of multiple contact quantum well lasers is limited by the intra-cavity saturable absorber (~10 fJ). Such energy is not sufficient for most all-optical switching/demultiplexing systems.

What is needed is an apparatus and method for the generation of short optical pulses in external cavity mode-locked semiconductor lasers with saturable Bragg reflector.

What is further needed is an apparatus and method for effective in broadening the mode-locked spectrum and reducing the pulses width.

BRIEF SUMMARY OF THE INVENTION

The invention is a laser capable of generating short pulses of less than 1000 femtoseconds comprising a semiconductor laser. And a resonant optical cavity having a reflecting mirror in which the mirror comprises a saturable Bragg reflector.

In the illustrated embodiment the semiconductor laser comprises a InGaAs/InGaAsP/InP buried heterostructure multiple quantum well laser fabricated using organometallic vapor phase epitaxy.

In one embodiment the resonant optical cavity is an external cavity, while in a second embodiment it is an internal cavity. The internal cavity includes an antiresonant Fabry-Perot saturable absorber disposed between a pair of diffraction Bragg reflectors within the internal cavity. The laser further comprises an inclined monolithic mirror to direct light to the antiresonant Fabry-Perot saturable absorber within the internal cavity.

In the illustrated embodiment the laser includes a basal substrate. The antiresonant Fabry-Perot saturable absorber is disposed on the substrate and the semiconductor laser is disposed on the antiresonant Fabry-Perot saturable absorber. Alternatively, the semiconductor laser may be disposed on the substrate and the antiresonant Fabry-Perot saturable absorber disposed on the semiconductor laser.

The saturable Bragg reflector is comprised of substrate, a Bragg stack disposed on the substrate and a multiple quantum well disposed on the Bragg stack. The substrate is composed of GaAs. The Bragg stack is comprised of multiple layers of GaAs/AlAs. The multiple quantum well is comprised of multiple layers of InGaAs/InGaAsP.

The laser further comprises a dispersive optic fiber optically coupled to the semiconductor laser for receiving and transmitting output therefrom to reduce frequency chirp. The optic fiber has a length which has been selected to minimize pulse width of the output from the semiconductor laser.

The invention is also a method of generating short laser pulses of less than 1000 femtoseconds in a mode locked laser comprising the steps of providing a semiconductor laser; providing a resonant external optical cavity having a reflecting mirror the mirror comprising a saturable Bragg reflector; coupling the resonant optical cavity in alignment with the semiconductor laser; adjusting external cavity alignment reverse-bias voltage of an on-chip saturable absorber in the semiconductor laser and forward gain currents of a gain section in the semiconductor laser to obtain a stable optical pulse output. The forward gain currents and reverse-bias voltage are biased to minimize pulse width of the stable optical pulse output.

The invention now having been briefly summarized, turn the following drawings, wherein like numerals reference like elements, and where the summarized invention is illustrated.

BRIEF DESCRIPTION OF THE DRAWINGS

FIG. 1 is a schematic of a bench test unit to demonstrate mode locking with saturable Bragg reflector.

FIG. 1A is an enlarged cross-sectional diagram showing the structure of saturable Bragg reflector.

FIG. 8 is a simplified side cross-sectional view of a second embodiment in which the resonant cavity is internal.

Figure 2:
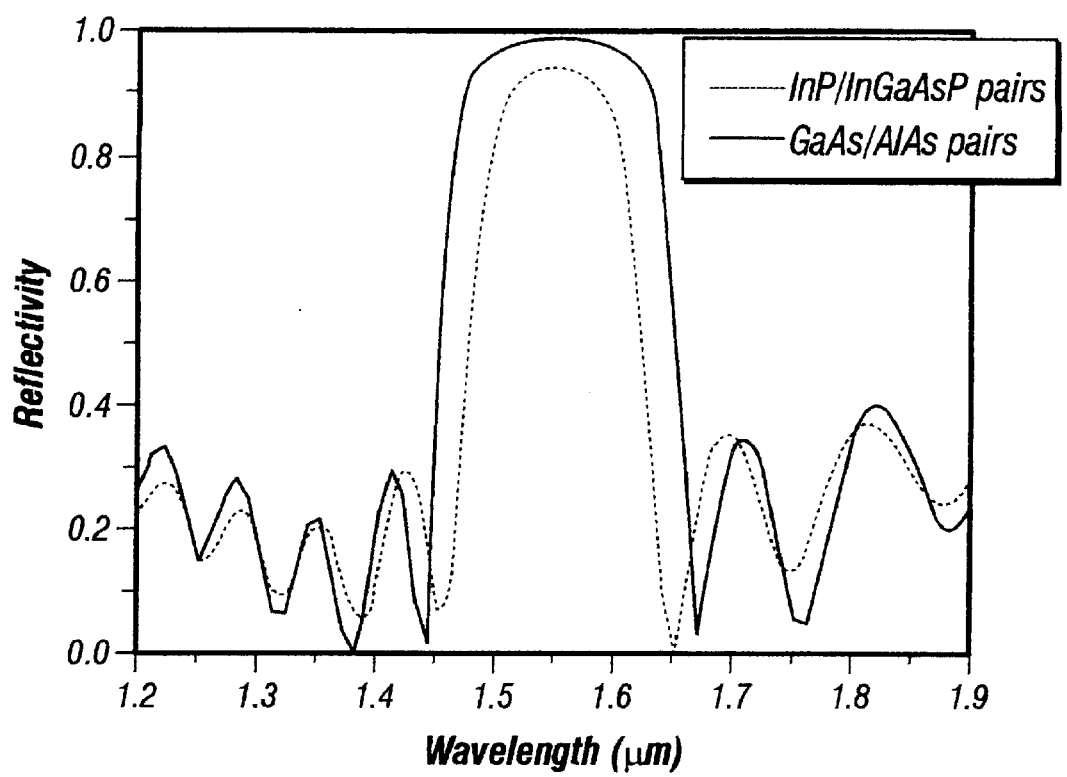
FIG. 2 is a graph of the reflection spectra of an InP/InGaAsP and GaAs/AlAs Bragg reflector.

The invention now having been illustrated by the above drawings, turn to the following detailed description wherein the illustrated embodiment is described for purposes of example. It is to be expressly understood that the scope of the invention is not limited by the illustrated embodiment which is specifically described, but includes the full scope of meaning and implication as set forth in the following claims.

DETAILED DESCRIPTION OF THE PREFERRED EMBODIMENTS

Although there has been progress in the area of ultrashort pulse generation by using the solid state lasers with saturable Bragg reflector, semiconductor optical sources have some special advantages. For example, the semiconductor lasers provide the advantages for high quantum efficiency, electrically pumped and high repetition frequency in the optical communication system. The preferred embodiment describes the use of a semiconductor laser, which has much lower intensities than solid sate gain media. The mode locking with saturable Bragg reflector is therefore different from that of solid state lasers. Thus what is described is the use of an external cavity mode-locked semiconductor lasers with saturable Bragg reflector to generate the sub-picosecond pulses for the first time. This provides the potential for the applications in communication or electro-optic sampling system. Mode locked pulses with 1.9 picosecond duration are generated by the present invention without external compensation. By coupling the output light to a 35-meter-long single mode fiber (SMF) to compensate the linear chirp, optical pulses with duration of 880 femtoseconds were achieved.

The laser 10 used in the illustrated embodiment in FIG. 1 is a buried heterostructure InGaAs/InGaAsP/InP multiple quantum well laser grown by organometallic vapor phase epitaxy. The multiple quantum well active region is comprised of five 5-nm-thick InGaAs quantum wells separated by four 22.5-nm-thick InGaAsP barrier layers. The lasing wavelength of the laser is 1.55 $\mu$m. The laser is divided into three sections: a 30-$\mu$m-long saturable absorber 12 located on one edge of the chip, a 1-mm-long gain section in the center 14, and another 30-pm-long section 16 on the other edge. The last section is not used in the illustrated embodiment. Detailed information about the laser has been described in M. C. Wu, Y. K. Chen, T. Tanbun-Ek, R. A. Logan, M. A. Chin, and G. Raybon, "*Transform-Limited* 1.4 Ps *Optical Pulses From A Monolithic Colliding-Pulse-Mode-Locked Quantum Well Laser*", Appl. Phys. Lett. Vol. 57, 759, 1990; and Chen and Wu, "*Monolithic Colliding-Pulse Mode-Locked Quantum Well Lasers*," IEEE J. Quantum Elec. Vol. 28, No. 10, 1992. Laser 10 itself is conventional and will thus not be further described except to the extent necessary for the context of the present invention.

The pulse repetition rate of mode locked semiconductor laser 10 is reduced to 1 GHz by coupling laser 10 to an external cavity 24 through two lenses, 18 and 20 as shown in FIG. 1. A conventional mirror or saturable Bragg reflector 22 is used as the reflector of the external cavity 24. The facet 26 facing external cavity 24 is antireflection (AR) coated to less than 1% reflectivity by a Si—SiO$_2$ thin film. The structure of the saturable Bragg reflector 22 is shown in FIG. 1A. Saturable Bragg reflector 22 is comprised of a semiconductor Bragg stack 28 and two sets of 15 InGaAs/InGaAsP strain-compensated multiple quantum wells 30 separated by 80 nm of lattice matched InGaAsP, which is a conventional structure as described in greater detail in C. H. Lin, C. L. Chua, Z. H. Zhu, F. E. Ejeckam, T. C. Wu, and Y. H. Lo, "*Photopumped Long Wavelength Verticle-Cavity Surface-Emitting Lasers Using Strain-Compensated Multiple Quantum Wells*", Appl. Phys. Lett. Vol. 64, 3395, 1994. To increase the bandwidth of the reflector, 27 pairs of GaAs/AlAs quarter-wave stack 28 is employed as the Bragg reflector instead of the conventional InGaAsP/InP mirror.

The increase in bandwidth is confirmed by the graph of the reflectivity of twenty-pair GaAs/AlAs and InGaAsP/InP Bragg reflector 22 as the function of wavelength as simulated and shown in the FIG. 2. GaAs/AlAs reflector 22 shows broader reflection bandwidth and lower loss, because it has a large refractive index step. This is important for short pulse generation with the saturable Bragg reflector at the telecommunication wavelength of 1.55 $\mu$m. Since the GaAs/AlAs mirror stack 28 is grown on a GaAs substrate 32, a conventional wafer-bonding technique is used to integrate the InP-based quantum wells 30 with the GaAs-based Bragg reflector 28 as is described in C. H. Lin, etal. supra, and C. L. Chua, Z. H. Zhu, Y. H. Lo, R. Bhat, and M. Hong, "*Low-Threshold* 1.57 $\mu$M *Vc-Sel's Using Strain-Compensated Quantum Wells And Oxide/Metal Backmirror*", IEEE Photon. Technol. Lett. Vol. 7, 444, 1995.

The output light of semiconductor laser 10 is coupled into an optical fiber 34 in FIG. 1 for testing. An optical isolator 36 has been employed to prevent the disturbance from reflected light. The output light is then amplified by a diode-pumped erbium-doped fiber amplifier (EDFA) 38 and directed to a noncollinear second harmonic generation (SHG) autocorrelator 40 with a $LiNbO_3$ crystal and an optical spectrum analyzer 42.

The threshold current of AR-coated laser 10 is reduced from 95 mA to 58 mA when it is aligned in external cavity 24. When the on-chip saturable absorber was reversed biased, passive mode locking occurred and optical pulses were observed. The pulse repetition frequency was adjusted to be 1 GHz, corresponding to the round-trip frequency of external cavity 24. Stable short optical pulses are achieved by properly adjusting the cavity alignment, reversebias voltage, and forward gain currents.

For comparison, different external reflectors (planar mirror and saturable Bragg reflector) were used to investigate the pulse-shortening effect of reflector 22. When a planar mirror is used as the external reflector 22, the shortest optical pulses width of 5.2 ps is obtained when the gain section and the on-chip saturable absorber are biased to 118 mA and −1.9 V, respectively.

Figure 3:
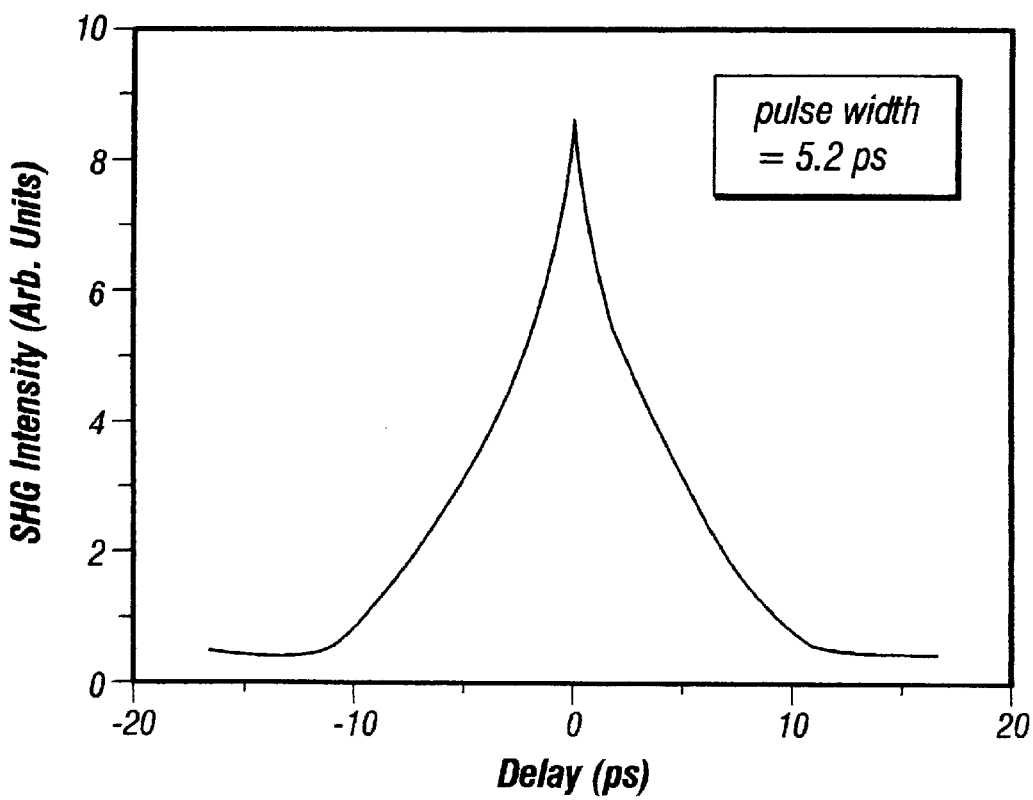
FIG. 3 is a graph of the SHG autocorrelation traces of the output pulses from the mode-locked laser with a planar mirror in the external cavity. The pulsewidth is 5.2 ps.
Figure 4:
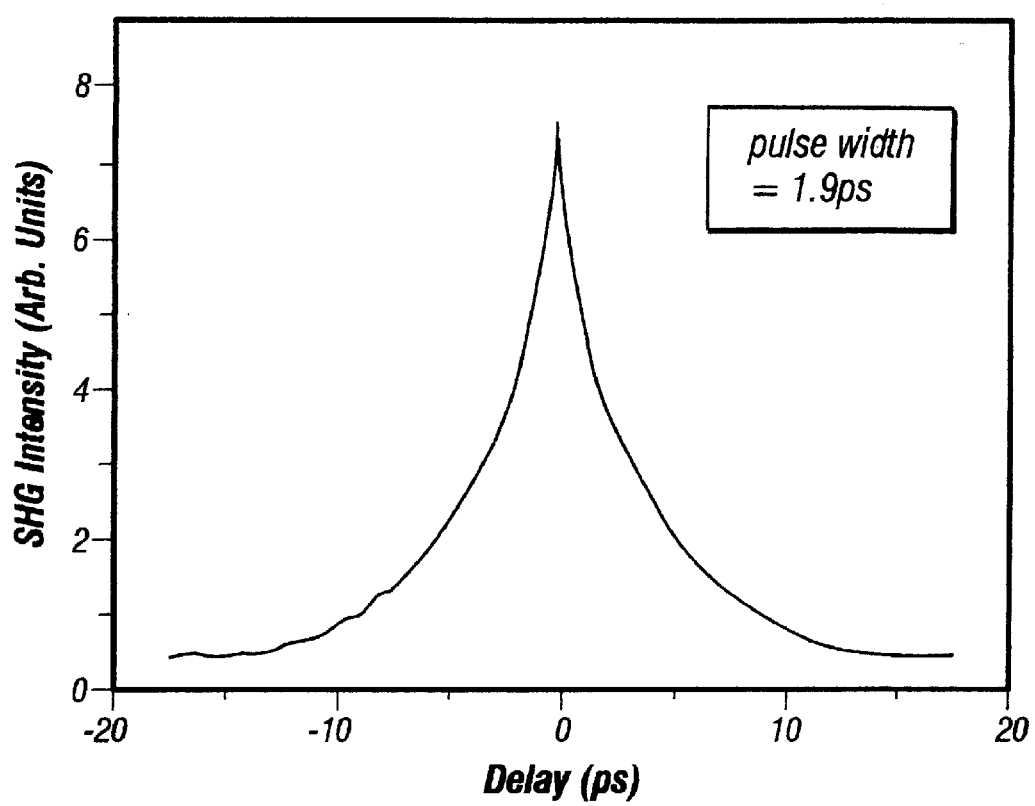
FIG. 4 is a graph of the SHG autocorrelation traces of the output pulses from the mode-locked laser with the saturable Bragg reflector in the external cavity. The pulsewidth is 1.9 ps.

The autocorrelation trace is shown in FIG. 3 which shows a pulse width of 5.2 ps. Under the same bias condition, the pulse width is reduced to 1.9 ps as shown in FIG. 4 when the planar mirror is replaced by a saturable Bragg reflector of FIG. 1A. Saturable Bragg reflector 22 is involved in the pulse-shortening although the mode-locking is started by the on-chip saturable absorber. The shorter pulse duration in the latter case indicates that the mode-locking mechanism is dominated by the absorption dynamics of saturable Bragg reflector 22. When a saturable Bragg reflector 22 is used as the external reflector, the mode locking in the laser is still started by the on-chip saturable absorber. However, saturable Bragg reflector 22 is involved in the pulse-shortening. This can be proven by the fact that shorter pulses duration were generated by using saturable Bragg reflector 22. The effect of saturable Bragg reflector 22 in the mode locking mechanism is somewhat complicated due to the combined absorption of saturable Bragg reflector 22 and the on-chip saturable absorber. The detailed mechanism regarding the function of saturable Bragg reflector 22 is not well understood. It is believed that the function of saturable Bragg reflector 22 is probably to help to speed up the recovery time of the absorption.

The peak wavelength is tunable by adjusting the position of the focusing lens 20 between laser 10 and saturable Bragg reflector 22 due to the chromatic aberrations in cavity 24. There was a broadening of the lasing spectrum when laser 10 was tuned to operate around 1565 nm, which corresponds to the excitonic absorption peak of quantum wells in saturable Bragg reflector 22. When the wavelength of laser 10 was moved away from the excitonic absorption of saturable Bragg reflector 22, the broadening of optical spectrum disappeared and the width of output pulses also increased. This demonstrates the effectiveness of saturable Bragg reflector 22 to broaden the mode-locked spectral width and shorten the optical pulses.

Figure 5:
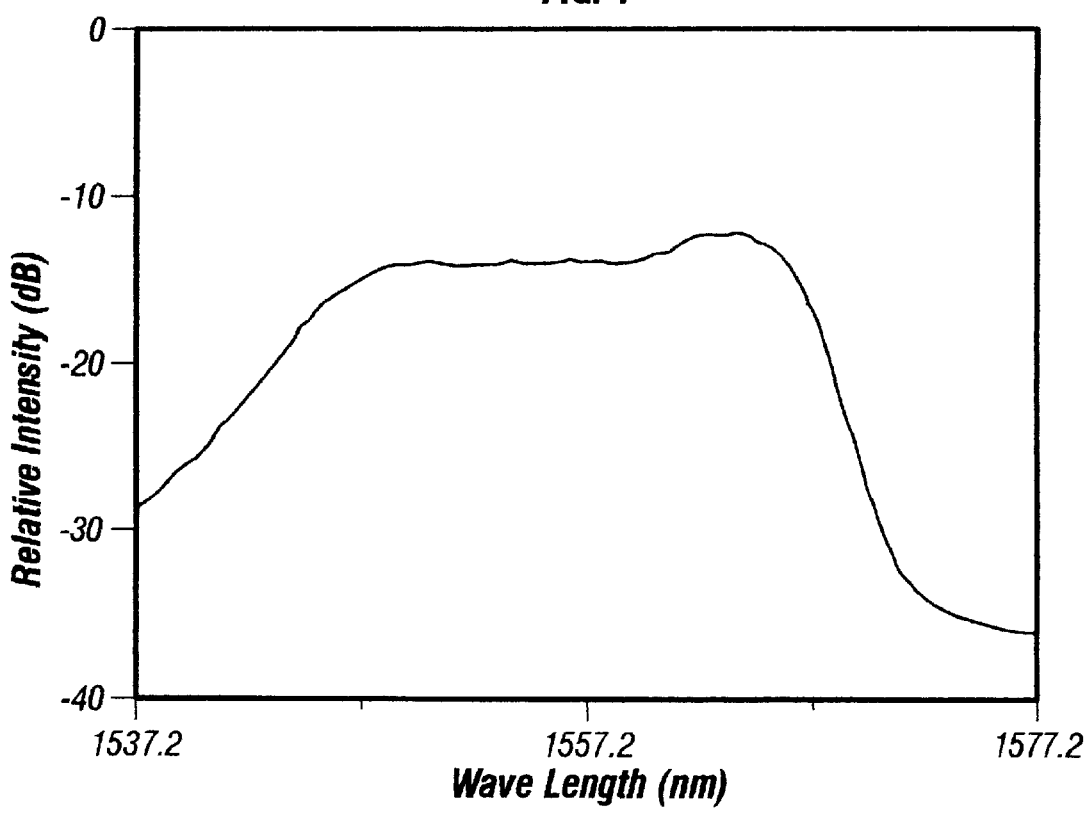
FIG. 5 is the time-averaged optical spectrum of the mode-locked laser which corresponds to FIG. 4.

The optical spectrum corresponding to the 1.9-ps-long pulses is shown in FIG. 5. The spectral width of the mode-locked pulses is approximately 7 nm. The time-bandwidth product of 1.63 is significantly larger than the theoretical value of 0.31 for transform-limited $sech^2$ pulses. This indicates that the pulses are strongly chirped, which may be due to the saturation of the carrier density in the absorber and the gain section. The pulse width can be shortened by compensating the frequency chirp. Grating pairs as described in M. Stern, J. P. Heritage, and E. W. Chase, "*Grating Compensation Of Third-Order Fiber Dispersion*", IEEE J. Quantum Electron., Vol. 28, 2742, 1992; and R. A. Salvatore, T. Schrans, and A. Yariv, "*Pulse Characteristic Of Passively Mode-Locked Diode Lasers*", Opt. Lett., Vol. 20, 737, 1995 and prism pairs as described in R. L. Fork, C. H. Brito Cruz, P. C. Becker, and C. V. Shank, "*Compression Of Optical Pulses To Six Femtoseconds By Using Cubic Phase Compensation*", Opt. Lett. Vol.12, pp. 483, 1987 are generally used to compensate the linear and the high-order chirp. However, these techniques are very sensitive to the alignment. Linear chirp can be compensated by dispersive fibers. This scheme does not require any optical alignment and has very low loss.

Figure 6:
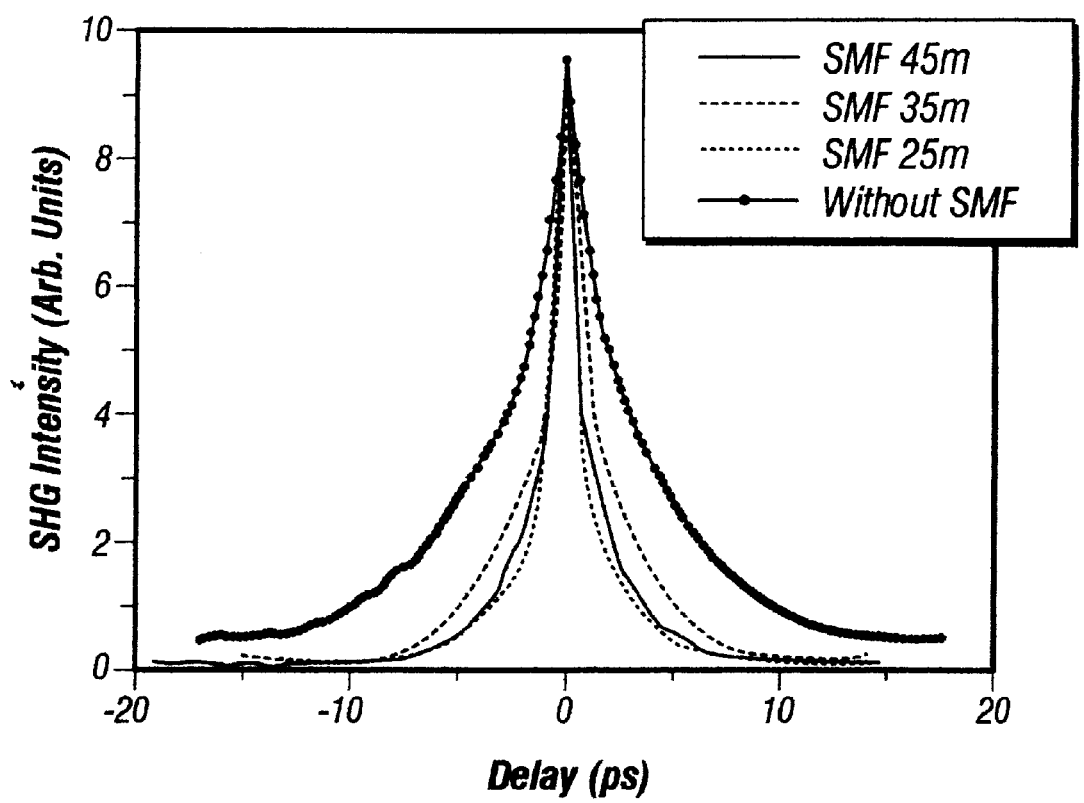
FIG. 6 is a graph of the SHG autocorrelation traces after compression using SMF at different fiber lengths. The shortest pulsewidth is found when the SMF length at 35 m.
Figure 7:
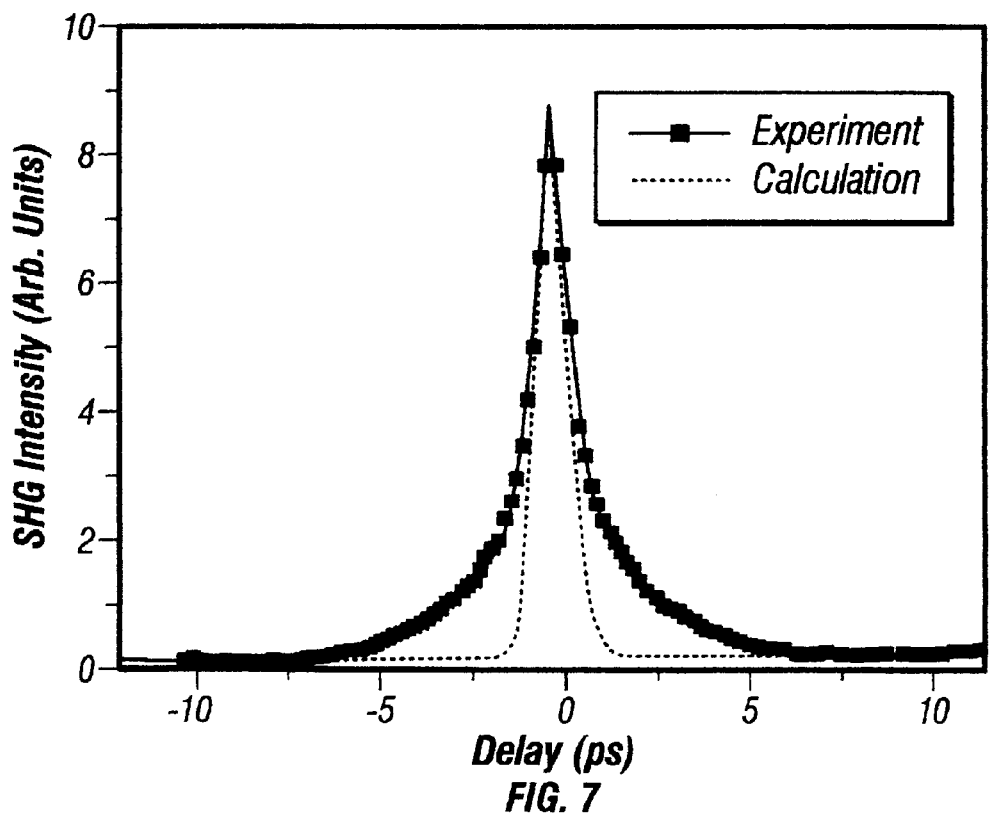
FIG. 7 is a graph of the SHG autocorrelation traces wherein the shortest pulses are compared with the calculated values using the hyperbolic second waveform.

In the illustrated embodiment, a standard single mode fiber with a group velocity dispersion GVD=16 ps/km/nm and a dispersion slope=0.07 ps/km/nm$^2$ is used to compensate the first-order chirp. The length of the single mode fiber has been optimized for shortest pulse width. The autocorrelation traces measured for various lengths of the single mode fiber are shown in FIG. 6. The shortest pulses are achieved when the length of single mode fiber is 35 m, corresponding to the total dispersion of 0.64 ps/nm. The autocorrelation trace of the shortest pulses is fifted by a $sech^2$-pulse shape with a duration of 880 fs, as shown in the FIG. 7. The time-bandwidth product is reduced to 0.76 after the compensation. The deviation between the theory and experiment in the pedestal of the curve as shown in FIG. 7 indicates the presence of high-order chirps. The high-order chirp can be compensated by using two types of the optical fibers with different group-velocity dispersions as described by S. Arahira, S. Kutsuzawa, Y. Matsui, and Y. Ogawa, "*Higher Order Chirp Compensation Of Femtosecond Mode-Locked Semiconductor Lasers Using Optical Fiber With Different Group Velocity Dispersions*", IEEE J. of Selected Topics in Quantum Electron., Vol. 2, pp.480, 1996, or using the grating pair method M. Stern et.al., supra. The output pulses generated by laser 10 have also been compensated with planar mirror. The compressed pulses have a pulse-width of 3.8 ps (not shown here), which is much longer than 880 fs.

In conclusion, passively mode-locked semiconductor laser with an external saturable Bragg reflector 22 has been investigated for the first time. Optical pulses with duration of 1.9 ps and 880 fs have been achieved without and with linear chirp compensation, respectively. These pulses are significantly shorter than those generated without using a saturable Bragg reflector. Thus it has been demonstrated that a saturable Bragg reflector 22 is very effective for subpicosecond pulse generation in an external cavity mode locked semiconductor laser 10.

In another embodiment the illustrated invention is a femtosecond semiconductor laser 44 as shown in FIG. 8 which employs a vertically coupled antiresonant Fabry-Perot saturable absorber 46. Laser 44 is comprised of a conventional edge-emitting semiconductor laser 48 sitting on top of epitaxial antiresonant Fabry-Perot saturable absorber 46 having a diffraction Bragg reflector 50 disposed between laser 48 and absorber 46 and a diffraction Bragg reflector 52 disposed between basal substrate 54 and absorber 46 as shown in FIG. 8. Laser 44 is coupled to antiresonant Fabry-Perot saturable absorber 46 through a monolithic dry-etched 45° mirror 56. Diffraction Bragg reflector 50 is arranged and configured so that it is partially reflective and partially transmissive, like a half-silvered mirror, or at least has a window defined therethrough to allow transmission of at least a portion of the light from mirror 56 into antiresonant Fabry-Perot saturable absorber 46.

There are several unique advantages for the femtosecond semiconductor laser 44. First, saturable absorber 46 is decoupled from the gain medium of laser 48 and, therefore, can be separately optimized for shorter pulses. For example, it can be made into a fast saturable absorber by employing low-temperature grown GaAs. Second, by placing saturable absorber 46 inside an antiresonant Fabry-Perot cavity, its saturation energy can be increased 100 fold (1 to 10 pJ). Thus much higher peak/average power can be obtained from the proposed femtosecond semiconductor laser 44. The concept of an antiresonant Fabry-Perot saturable absorber in general was first proposed by Keller et al for solid state laser. See, Keller et.al., Optics Letters, Vol. 17, p.505, 1992. Optical pulses shorter than 50 fs has been demonstrated in Ti:Sapphire lasers.

The structure of the proposed femtosecond semiconductor laser is particularly suitable for monolithic integration. As show in FIG. 8, the epitaxial layers of laser 44 lie directly on top of the antiresonant Fabry-Perot saturable absorber layers 50, 46 and 52. Thus the structure can be fabricated in one epitaxial growth. The diffraction Bragg reflector mirrors 50 and 52 and the antiresonant Fabry-Perot saturable absorber 46 can alternatively be placed on top of the laser layers, the reverse stacking order of FIG. 8 in which case the epitaxial diffraction Bragg reflector mirrors 50 and 52 can either be grown by epitaxy or dielectric deposition. The diffraction Bragg reflector mirrors 50 and 52 have a broad reflection bandwidth of 70 nm, and can support optical pulses shorter than 50 fs.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A laser capable of generating short pulses of less than 1000 femtoseconds comprising:
   a semiconductor laser; and
   a resonant optical cavity having a reflecting mirror, said mirror comprising a saturable Bragg reflector.

2. The laser of claim 1 wherein said semiconductor laser comprises a buried heterostructure multiple quantum well laser.

3. The laser of claim 2 wherein said buried heterostructure multiple quantum well laser comprises an InGaAs/InGaAsP/InP buried heterostructure multiple quantum well laser.

4. The laser of claim 3 wherein said InGaAs/InGaAsP/InP buried heterostructure multiple quantum well laser is fabricated using organometallic vapor phase epitaxy.

5. The laser of claim 1 wherein said resonant optical cavity is an external cavity.

6. The laser of claim 1 wherein said resonant optical cavity is an internal cavity.

7. The laser of claim 6 wherein said internal cavity includes an antiresonant Fabry-Perot saturable absorber.

8. The laser of claim 7 further comprising a pair of diffraction Bragg reflectors disposed within said internal cavity and wherein said antiresonant Fabry-Perot saturable absorber is disposed between said pair of diffraction Bragg reflectors.

9. The laser of claim 7 further comprising an inclined monolithic mirror to direct light to said antiresonant Fabry-Perot saturable absorber within said internal cavity.

10. The laser of claim 8 further comprising an inclined monolithic mirror to direct light to said antiresonant Fabry-Perot saturable absorber disposed between said pair of diffraction Bragg reflectors within said internal cavity.

11. The laser of claim 7 wherein further comprising a basal substrate, said antiresonant Fabry-Perot saturable absorber being disposed on said substrate and said semiconductor laser being disposed on said antiresonant Fabry-Perot saturable absorber.

12. The laser of claim 7 wherein further comprising a basal substrate, said semiconductor laser being disposed on said substrate and said antiresonant Fabry-Perot saturable absorber being disposed on said semiconductor laser.

13. The laser of claim 1 where said saturable Bragg reflector is comprised of substrate, a Bragg stack disposed on said substrate and a multiple quantum well disposed on said Bragg stack.

14. The laser of claim 13 where said substrate is composed of GaAs, said Bragg stack is comprised of multiple layers of GaAs/AlAs, and said multiple quantum well is comprised of multiple layers of InGaAs/InGaAsP.

15. The laser of claim 1 further comprising a dispersive optic fiber optically coupled to said semiconductor laser for receiving and transmitting output therefrom to reduce frequency chirp.

16. The laser of claim 15 wherein said optic fiber has a length and wherein said length has been selected to minimize pulse width of said output from said semiconductor laser.

17. A laser comprising:
   a semiconductor buried heterostructure multiple quantum well laser; and
   an external resonant optical cavity having a saturable Bragg reflector as a reflecting mirror for said external resonant optical cavity.

18. The laser of claim 17 where said saturable Bragg reflector is comprised of substrate, a Bragg stack disposed on said substrate and a multiple quantum well disposed on said Bragg stack.

19. The laser of claim 18 where said substrate is composed of GaAs, said Bragg stack is comprised of multiple layers of GaAs/AlAs, and said multiple quantum well is comprised of multiple layers of InGaAs/InGaAsP.

20. The laser of claim 17 further comprising a dispersive optic fiber optically coupled to said semiconductor laser for receiving and transmitting output therefrom to reduce frequency chirp.

21. A method of generating short laser pulses of less than 1000 femtoseconds in a mode locked laser comprising:

providing a semiconductor laser;

providing a resonant external optical cavity having a reflecting mirror, said mirror comprising a saturable Bragg reflector;

coupling said resonant optical cavity in alignment with said semiconductor laser;

adjusting external cavity alignment, reverse-bias voltage of an on-chip saturable absorber in said semiconductor laser, and forward gain currents of a gain section in said semiconductor laser to obtain a stable optical pulse output; and biasing said forward gain currents and reverse-bias voltage to minimize pulse width of said stable optical pulse output.

* * * * *